United States Patent
Autry et al.

(10) Patent No.: US 7,435,993 B2
(45) Date of Patent: Oct. 14, 2008

(54) HIGH TEMPERATURE, HIGH VOLTAGE SIC VOID-LESS ELECTRONIC PACKAGE

(75) Inventors: Tracy Autry, Trabuco Canyon, CA (US); Steven G. Kelly, Melrose, MA (US)

(73) Assignee: Microsemi Corporation, Irvine, CA (US)

( * ) Notice: Subject to any disclaimer, the term of this patent is extended or adjusted under 35 U.S.C. 154(b) by 0 days.

(21) Appl. No.: 11/973,573

(22) Filed: Oct. 9, 2007

(65) Prior Publication Data

US 2008/0105958 A1    May 8, 2008

Related U.S. Application Data

(60) Provisional application No. 60/850,470, filed on Oct. 6, 2006.

(51) Int. Cl.
*H01L 23/498* (2006.01)
*H01L 21/00* (2006.01)
*H01L 23/535* (2006.01)
*H01L 23/58* (2006.01)
*H01L 23/29* (2006.01)

(52) U.S. Cl. .......................... 257/77; 257/676; 257/787; 257/792; 257/E23.002; 257/E23.011; 257/E23.124; 257/E23.125

(58) Field of Classification Search ................. 438/127; 257/77, 676, 787, 792, E23.002, E23.011, 257/E23.124, E23.125
See application file for complete search history.

(56) References Cited

U.S. PATENT DOCUMENTS

| | | | |
|---|---|---|---|
| 3,780,432 A | 12/1973 | Baas et al. | |
| 3,902,148 A | 8/1975 | Drees et al. | |
| 3,922,712 A | 11/1975 | Stryker | |
| 6,597,063 B1 | 7/2003 | Shimizu et al. | |
| 2002/0070439 A1 | 6/2002 | Hiramatsu et al. | |
| 2002/0163070 A1 | 11/2002 | Choi | |
| 2004/0251533 A1 | 12/2004 | Suzuki et al. | |
| 2005/0161251 A1 | 7/2005 | Mori et al. | |
| 2005/0285228 A1 | 12/2005 | Sugawara | |

FOREIGN PATENT DOCUMENTS

| | | |
|---|---|---|
| DE | 196 25 240 A1 | 4/1997 |
| DE | 196 47 590 A1 | 5/1998 |
| DE | 10 2005 040 058 A1 | 3/2006 |
| WO | WO 2004/102659 A2 | 11/2004 |

OTHER PUBLICATIONS

Written Opinion/Search Report, Mar. 18, 2008, Isa.

*Primary Examiner*—Evan Pert
(74) *Attorney, Agent, or Firm*—Jackson Walker LLP; Robert C. Klinger

(57) ABSTRACT

An electronic package designed to package silicon carbide discrete components for silicon carbide chips. The electronic package allows thousands of power cycles and/or temperature cycles between −55° C. to 300° C. The present invention can also tolerate continuous operation at 300° C., due to high thermal conductivity which pulls heat away from the chip. The electronic package can be designed to house a plurality of interconnecting chips within the package. The internal dielectric is able to withstand high voltages, such as 1200 volts, and possibly up to 20,000 volts. Additionally, the package is designed to have a low switching inductance by eliminating wire bonds. By eliminating the wire bonds, the electronic package is able to withstand an injection mold.

20 Claims, 2 Drawing Sheets

HIGH TEMPERATURE, HIGH VOLTAGE SIC VOID-LESS ELECTRONIC PACKAGE

PRIORITY CLAIM

This application claims priority of U.S. Provisional Patent Application Ser. No. 60/850,470, entitled "HIGH TEMPERATURE, HIGH VOLTAGE SIC VOID-LESS ELECTRONIC PACKAGE" filed Oct. 6, 2006, the teachings of which are incorporated herein by reference.

FIELD OF THE INVENTION

The present invention is generally related to electronic packaging, and more specifically to high temperature, high voltage SiC semiconductor electronic packaging.

BACKGROUND OF THE INVENTION

Most, if not all electronic suppliers use transfer molding to package their devices. Primarily, because transfer molding is significantly less abusive to an electronic device. The process of transfer molding does not sweep the wires (rip off the wires connecting the components to be packaged). Orthogonally, injection molding creates an extremely harsh environment for device packaging. The process of injection molding, injects the electrically non-conductive material at extremely high velocities and pressures where the material enters the mold cavity. Injection molding will typically, if not always, sweep the wires (rip the wires free from the chip) as it is molding. In a typical electronic package, when power cycling a device to failure, the failure is usually due to a wire bond lifting from the die or dice.

SUMMARY OF INVENTION

The present invention achieves technical advantages as an electronic package designed to package silicon carbide discrete components for silicon carbide chips. One embodiment of the invention is adapted to allow thousands of power cycles and/or temperature cycling between −55° C. to 300° C. The present invention can also tolerate continuous operation at 300° C., due to high thermal conductivity which pulls heat away from the chip and the use of high temperature molding material. The electronic package can be designed to house a plurality of interconnecting chips within the package. The internal dielectric is able to withstand high voltage, such as 1200V, and possibly up to 20,000 volts. Additionally, the package is designed to have a low switching inductance and high surge capability by eliminating wire bonds. By eliminating the wire bonds, the electronic package is able to withstand an injection mold.

DETAILED DESCRIPTION OF THE PRESENT INVENTION

The present invention is directed at the high temperature involved with power cycling, typically −55° C. to 300° C. Removal of the delicate wire bonds in the assembly allows injection molding to be used to package the device, as opposed to transfer molding. By using injection molding, a high temperature polyimide mold compound material can be used. Currently, the polyimide mold compound material is not available in material appropriate for transfer molding, only in material suitable for injection molding. Advantageously, removing the wire bonds reduces the inductance, and thereby improves the switching response time and increase the surge capability. Wire bond removal also facilitates an increase in the power cycling capability, so that the device can thermal cycle or power cycle many more times than a wire bond device. Brazing full expansion matched materials, which have a large footprint, provide better thermal expansion matching and create a significantly stronger bond.

Figure 1:
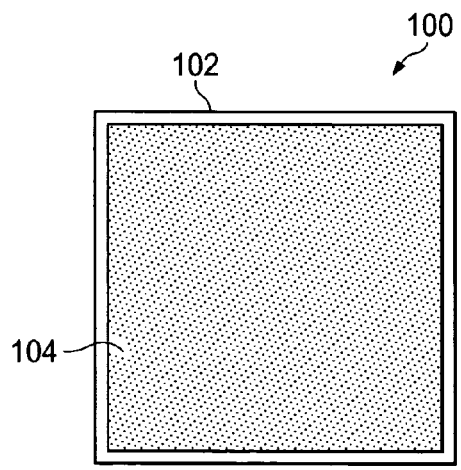
FIG. 1 is a diagram of a bottom-side of a ceramic substrate in accordance with an exemplary embodiment of the present invention.

Referring to FIG. 1, there is shown at 100 a diagram of a bottom-side view of a ceramic substrate in accordance with an exemplary embodiment of the present invention. Ceramic substrate 102 has metallization 104 covering a significant area of the back side of ceramic substrate 102.

Figure 2:
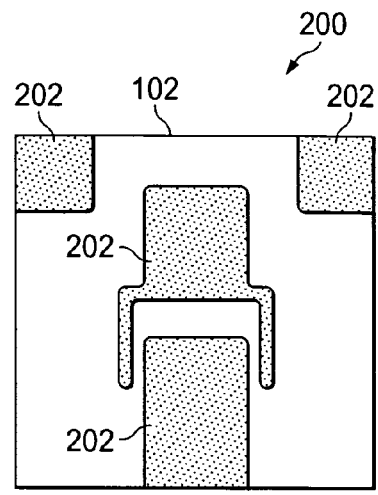
FIG. 2 is a diagram of a top-side of a ceramic substrate in accordance with an exemplary embodiment of the present invention.

Referring now to FIG. 2, there is shown at 200 a top-side view of a ceramic substrate in accordance with an exemplary embodiment of the present invention. Ceramic substrate 102 has metallization 202 where electronic components will be in contact with ceramic substrate 102. In one exemplary embodiment, ceramic substrate 102 is metalized with molybdenum-manganese, high temperature refractory metallization. In a second exemplary embodiment, ceramic substrate 102 is metalized with nickel-boron, high temperature refractory metallization. In a third exemplary embodiment, ceramic substrate 102 is metalized with nickel sulfamate, high temperature refractory metallization. In a fourth exemplary embodiment, the source metallization material is evaporated in a vacuum, allowing the metallic vapor particles to propagate toward the ceramic substrate, where they condense back into a solid state, thereby metalizing ceramic substrate 102.

Figure 3:
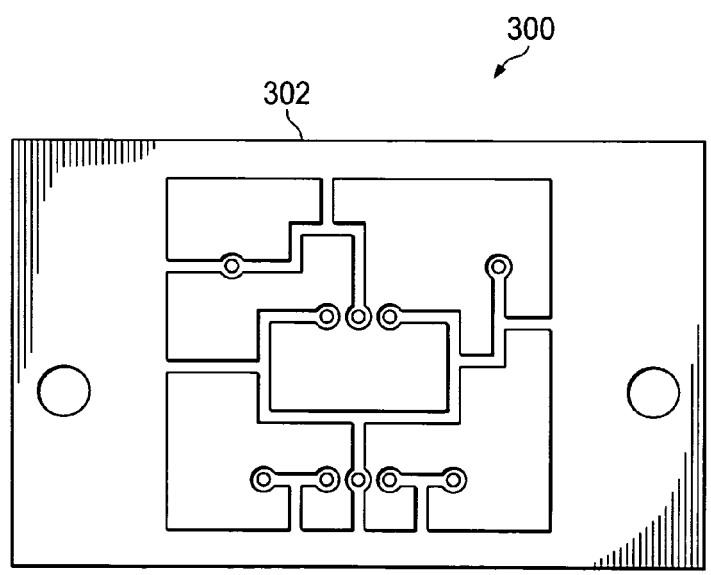
FIG. 3 is a diagram of a connector-pin etch in accordance with an exemplary embodiment of the present invention.

Referring now to FIG. 3, there is shown at 300 a connector-pin etching in accordance with an exemplary embodiment of the present invention. Connector etch plate 302 is formed with a highly conductive material, which is etched with connectors adapted to provide electrical communication between two elements. Connector etch plate 302 is brazed to each die pin, thereby forgoing wire bonds. After connector etch plate 302 is brazed onto the die, all the tie bars are cut away and the non-connector portion of connector etch plate 302 is removed, leaving a complete circuit. In one exemplary embodiment, connector etch plate 302 is made of copper. In a second exemplary embodiment, connector etch plate 302 is a coefficient of expansion matched material (such as tungsten) with the SiC die. Thus, eliminating thermal mismatch to the SiC die.

Figure 4:
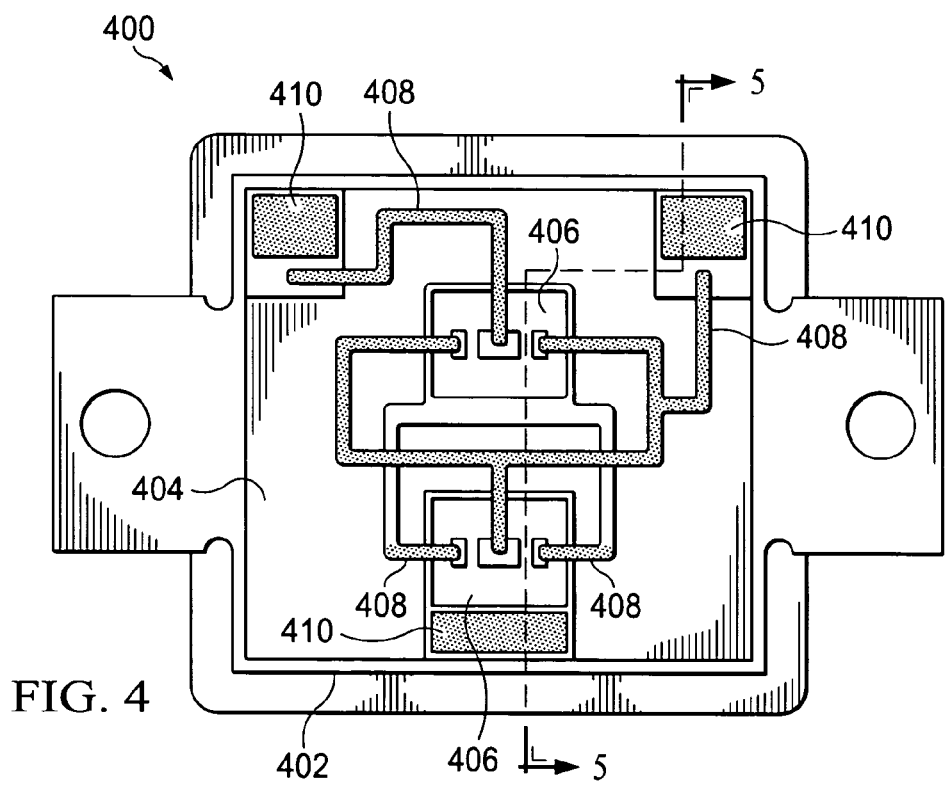
FIG. 4 is a diagram of a top-view of top view of an SiC electronic assembly prior to molding in accordance with an exemplary embodiment of the present invention.

Referring now to FIG. 4, there is shown at 400 a diagram of a top view of a SiC electronic assembly prior to molding in accordance with an exemplary embodiment of the present invention. Electronic assembly 400 is comprised of heatsink 402, ceramic substrate 404, die 406, etched connector 408, and conductive pad 410.

Heatsink 402 is a low thermal expansion metal base of molybdenum or copper-molybdenum. Heatsink 402 provides additional heat dissipation, by drawing heat away from die 406. In one exemplary embodiment, heatsink 402 has a half-edge locking mechanism disposed around its outer edge; however, any suitable locking mechanism can be used. Ceramic substrate 404 is metalized on both top and bottom. Die 406 is a SiC die. In one exemplary embodiment, the die is a diode. In a second exemplary embodiment die 406 has a plurality of cathodes and anodes (transistor). Etched connector 408 is made of a highly conductive material, such as copper. Conductive pad 410 is made of a low thermal expansion material, such as molybdenum.

To manufacture assembly 400, heatsink 402 is brazed onto the bottom side of ceramic substrate 404. Three of conductive pad 410 is disposed onto the metallization on the top side of ceramic substrate 404. In one exemplary embodiment one conductive pad 410 is disposed on ceramic substrate 404. In a second exemplary embodiment, pluralities of conductive pad 410 are disposed onto ceramic substrate 404. Two high temperature silicon carbide die 406 are brazed onto the metallization on the top side of ceramic substrate 404. A low thermal expansion pin of molybdenum or copper-molybdenum is disposed on each conductive pad 410. Disposed over each low thermal expansion pin is an etched connector plate, having etched connector 408. At this point, the three leads are brazed onto their respective conductive pad 410.

Assembly 400 is typically manufactured in stages. All stages are attached to each other using a high-temperature braze at a temperature greater than 500° C. Assembly 400 is constructed in three stages, but could be shortened down to two in certain situations. Stage one brazes heatsink 402 to ceramic substrate 404 to allow electrical communication. At the same time, die 406 and conductive pad 410 are brazed onto ceramic substrate 404. Then, the low expansion pins are brazed onto die 406 and conductive pad 410. Finally, etched connector 408 is brazed onto the low expansion pins, completing stage one.

Stage 2 two brazes the leads with either an equal or lower melting point braze to conductive pad 410. After which, the lead frame is cut out to form the interconnected circuit, completing stage two. In one exemplary embodiment, a dielectric coating is added to the components, prior to molding, to provide additional dielectric functionality. In a second exemplary embodiment, the dielectric is added by flame spraying a glass or ceramic material onto assembly 400. The dielectric must be greater than 300° C. if organic materials cannot be used.

Stage three inserts assembly 400 into an injection mold and injects a molding compound to form a package. Then, if any lead forming must be done, it would occur after the injection molding, completing stage three. In one exemplary embodiment, assembly 400 is manufactured in two stages: all the brazing is done in "one shot," and then assembly 400 is injection molded.

Figure 5:
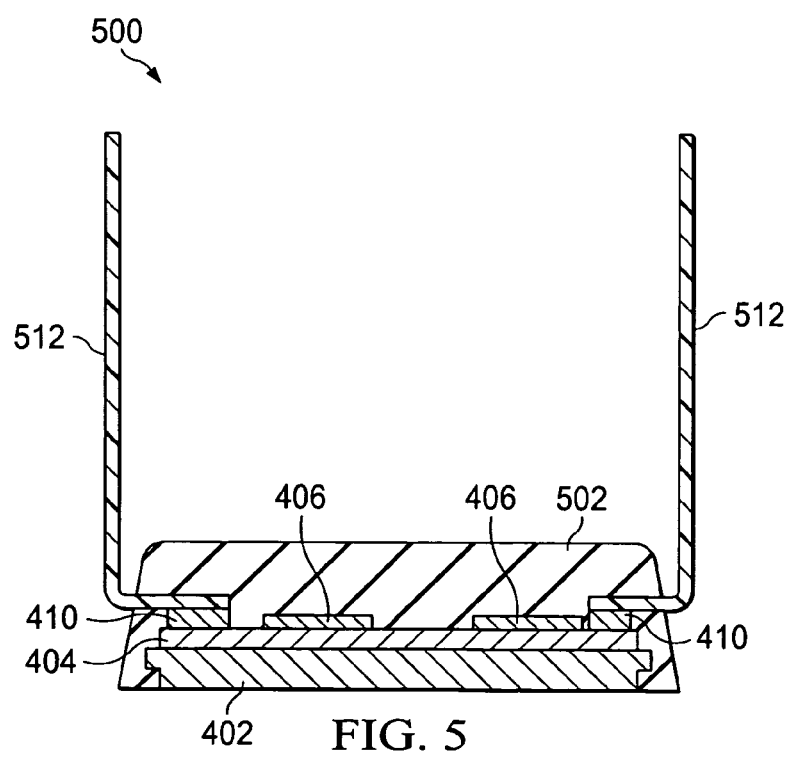
FIG. 5 is a diagram of a cross-section of FIG. 5 of a high temperature, high voltage SiC void-less electronic package in accordance with an exemplary embodiment of the present invention.

Referring now to FIG. 5, there is shown at 500 a cross-section of a high temperature, high voltage SiC void-less electronic package in accordance with an exemplary embodiment of the present invention. Cross-section 500 is taken at line 5-5 of FIG. 4. High-temperature injection mold compound 502 encapsulates heatsink 402, ceramic substrate 404, conductive pad 410, SiC die 406, and a first end of each of leads 512. In one exemplary embodiment, high-temperature injection mold compound 502 is polyimide, such as Aurum, distributed by E.I. du Pont de Nemours & Co. of Wilmington, Del. The polyimide functions as a dielectric on the die, protecting the die from arcing and facilitating high voltage tolerance.

Once the electronic components are assembled, the assembly is placed into an injection mold machine where the mold void is injected with high-temperature injection mold compound 502, providing a void-free high temperature dielectric electronic package. The device can be supplied ready for installation into an electronic circuit by means of soldering, using standard industry methods, or it can be welded into a circuit using resistance welding. Mechanical "crimping" can also be used. The device can be mounted to a circuit board by mechanical screws or soldering. A half-edge locking mechanism is disposed around the circumference of the heatsink to allow the polyimide to adhere to the assembly, but any suitable attachment method can also be used.

In one exemplary embodiment, a plurality of die can be aggregated into a strip, such as in an 8-chip or 10-chip module. In a second exemplary embodiment, pluralities of assemblies are interconnected within a single package. In a third exemplary embodiment, the package has one pin out. In a fourth exemplary embodiment, the package can have a plurality of pin outs. In a fourth exemplary embodiment, the package is adapted to withstand high surge, high current. If all the pins are shorted together due to a common lead frame, after brazing, the lead frame is trimmed so that the package is not shorted.

The present invention derives technical advantages because first, other solutions cannot temperature cycle more than a few hundred cycles before failure. Moreover, other devices contain wire bonds as part of their construction, prohibiting injection molding. Other designs are a "cavity" type package instead of being void-free.

The present invention achieves further technical advantages because: enables 300° C. continuous operation, can be used on high voltage devices (up to 13 kV), surface mount design, compatible with standard high volume manufacturing practices, use of high temperature materials that are injection moldable, such as polyimide, >325° C. high temperature die attach, no internal wire bonds (increased reliability, lower parasitics), can be configured with multiple die for applications such as cascade configuration, provides void-less molded construction for high voltage, high frequency applications (reduces corona problems), very low thermal resistance makes it easier to remove heat from the die, and materials matched coefficient of expansion allows extreme temperature cycling for rugged applications.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A high temperature, high voltage SiC void-less electronic package, comprising:
   a die adapted to provide power switching;
   a ceramic substrate adapted to electrically isolate the die;
   at least one electrical component disposed on the substrate;
   an etched connector adapted to provide electrical communication to the die and the at least one electrical component in the electronic package, thereby allowing the electronic package to be injection molded;
   a conductive pad adapted to provide electrical communication to a lead of the electronic package and the etched connector; and a high temperature injection mold compound encapsulating the die and the at least one electrical component and the etched connector and forming the void-less electronic package and providing endurance to a plurality of power cycles, and/or a plurality of temperature cycles.

2. The high temperature, high voltage SiC void-less electronic package of claim 1, wherein the high-temperature injection mold compound is polyimide.

3. The high temperature, high voltage SiC void-less electronic package of claim 1, further comprising a lead electrically coupled to the etched connector.

4. The high temperature, high voltage SiC void-less electronic package of claim 1, wherein the temperature cycles between −55° C. and 300° C.

5. The high temperature, high voltage SiC void-less electronic package of claim 1, wherein the ceramic substrate is metalized.

6. The high temperature, high voltage SiC void-less electronic package of claim 4, wherein the electronic package can be used on high voltage devices up to 13 kV.

7. The high temperature, high voltage SiC void-less electronic package of claim 1, wherein the electronic package can operate continuously at temperatures up to 300° C.

8. The high temperature, high voltage SiC void-less electronic package of claim 1, wherein the electronic package can be used on high voltage devices up to 13 kV.

9. The high temperature, high voltage SiC void-less electronic package of claim 1, wherein the electronic package has a surface mount design.

10. The high temperature, high voltage SiC void-less electronic package of claim 1, wherein the die and the at least one electrical component of the electronic package are connected to the etched connector by brazing.

11. The high temperature, high voltage SiC void-less electronic package of claim 8, wherein the brazing is done at temperatures greater than 325° C.

12. The high temperature, high voltage SiC void-less electronic package of claim 1, wherein the etched connector material matches the coefficient of expansion of the die.

13. A high surge, high current SiC void-less electronic package, comprising:
    a die adapted to provide power switching;
    a ceramic substrate adapted to electrically isolate the die;
    an etched connector adapted to provide electrical communication between electrical components in the electronic package, thereby allowing the electronic package to be injection molded;
    a conductive pad adapted to provide electrical communication between a lead of the electronic package and the etched connector; and
    a high-temperature injection mold compound adapted to encapsulate the electrical components in the electronic package and provide endurance to a plurality of surge cycles, and/or a plurality of current cycles.

14. The high temperature, high voltage SiC void-less electronic package of claim 13, wherein the electrical components in the electronic package are connected by brazing.

15. The high temperature, high voltage SiC void-less electronic package of claim 13, wherein the brazing is done at temperatures greater than 325° C.

16. A method for manufacturing a high temperature, high voltage SiC void-less electronic package, comprising the steps of:
    performing a first stage, comprising the steps of:
        brazing a heatsink to a ceramic substrate;
        brazing a die and a conductive pad onto the ceramic substrate;
        brazing low expansion pins onto the die and the conductive pad; and
        brazing an etched connector onto the low expansion pins; and
    performing a second stage, comprising:
        brazing a lead frame, with an equal or lower melting point braze to the conductive pad; and
        cutting the lead frame out to form an interconnected circuit; and
    performing a third stage, comprising:
        disposing the interconnected circuit into an injection mold; and
        injecting a molding compound to encapsulate the ceramic substrate, the etch connector, and the die to form the void-less package.

17. The method of claim 16, further comprising adding a dielectric coating to after the second stage, prior to molding.

18. The method of claim 16, wherein the dielectric coating is added by flame spraying a glass or ceramic material onto the interconnected circuit.

19. The method of claim 16, wherein the first stage and the second stage are combined to form a single stage.

20. The method of claim 16, wherein the molding compound is polyimide.

* * * * *